350-332
XR 3,714,867
TX 3104 N
SOLID STATE WATCH INCORPORATING LARGE-SCALE INTEGRATED CIRCUITS
Filed April 29, 1971 5 Sheets-Sheet 1
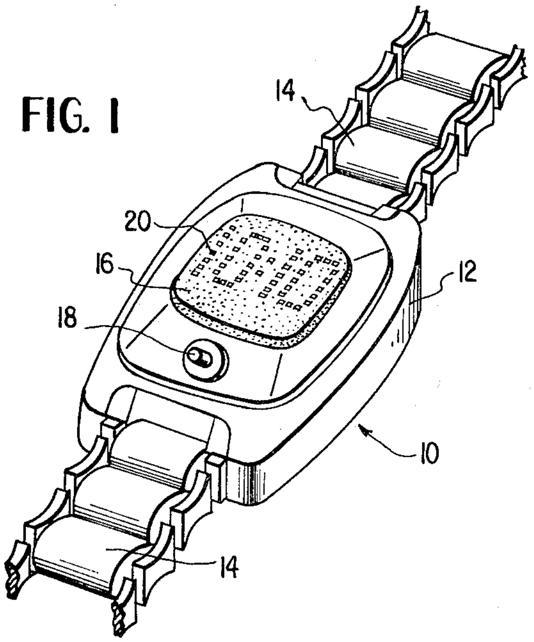
FIG. 1
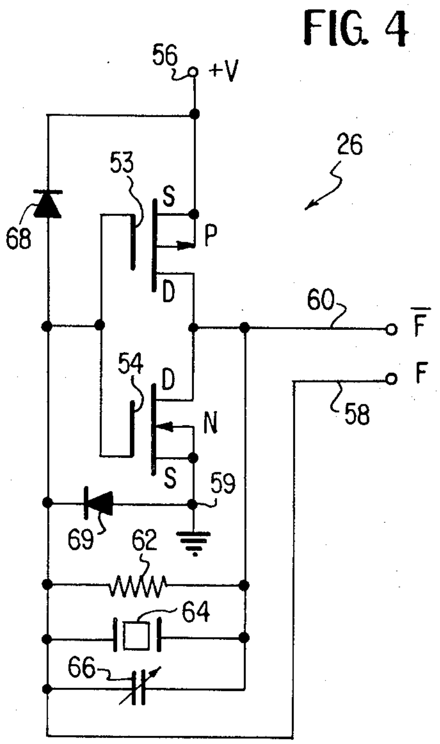
FIG. 4
FIG. 2
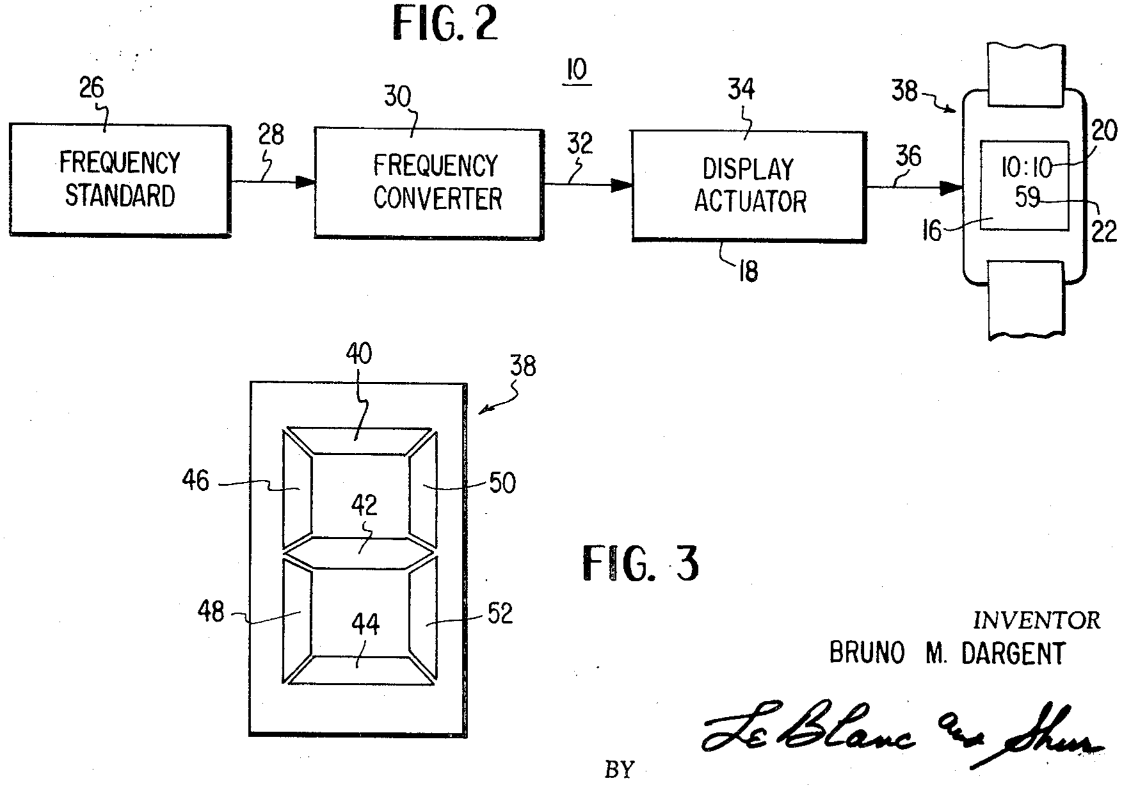
FIG. 2, FIG. 3
INVENTOR
BRUNO M. DARGENT
BY LeBlanc & Shur
ATTORNEYS.
3714867
OR IN 58/50R

INVENTOR
BRUNO M. DARGENT

BY

ATTORNEYS.

INVENTOR
BRUNO M. DARGENT

BY

Le Blanc & Shur
ATTORNEYS.

INVENTOR
BRUNO M. DARGENT

BY LeBlanc and Shur
ATTORNEYS.

INVENTOR
BRUNO M. DARGENT

BY Le Blanc and Shur
ATTORNEYS

United States Patent Office 3,714,867

Patented Feb. 6, 1973

3,714,867

SOLID STATE WATCH INCORPORATING LARGE-SCALE INTEGRATED CIRCUITS

Bruno M. Dargent, Lancaster, Pa., assignor to Hamilton Watch Company, Lancaster, Pa.

Filed Apr. 29, 1971, Ser. No. 138,547
Int. Cl. G04c *3/00;* G04b *19/30*
U.S. Cl. 58—50 R 20 Claims

ABSTRACT OF THE DISCLOSURE

Disclosed is a solid state wristwatch having no moving parts. A crystal oscillator supplies a timing signal through a binary divider and display actuator to an electro-optical display in the form of a digital array of light-emitting diodes. The vast majority of the electrical components of the watch are incorporated in one or more large-scale integrated circuits.

This invention relates to a solid state timepiece and more particularly to an electronic watch which employs no moving parts. In the present invention, a frequency standard in the form of a crystal oscillator acts through solid state electronic circuit dividers and drivers to power in timed sequence the light-emitting diodes of an electro-optic display. Low power consumption and small size and weight are achieved through the use of complementary MOS circuits to produce what is in essence a miniaturized fixed program computer. In particular, the present invention is directed to a wristwatch in which substantially all of the electrical circuitry may be constructed using large-scale integrated circuit techniques.

Battery-powdered wristwatches and other small portable timekeeping devices of various types are well known and are commercially available. The first commercially successful battery-powdered wristwatch was of the type shown and described in assignee's U.S. Re. Pat. No. Re. 26,187, reissued Apr. 4, 1967, to John A. Van Horn et al. for Electric Watch. Electric watches of this type employ a balance wheel and a hairspring driven by the interaction of a current-carrying coil and a magnetic field produced by small permanent magnets.

In recent years, considerable effort has been directed toward the development of a wristwatch which does not employ an electromechanical oscillator as the master time reference. In many instances, these constructions have utilized a crystal controlled high frequency oscillator as a frequency standard in conjunction with frequency conversion circuitry to produce a drive signal at a suitable timekeeping rate. However, difficulties have been encountered in arriving at an oscillator-frequency converter combination having not only the required frequency stability, but also sufficiently low power dissipation and small size to be practical for use in a battery-powdered wristwatch.

In order to overcome these and other problems, there is disclosed in assignee's U.S. Pat. No. 3,506,998, issued Feb. 2, 1971, a crystal controlled oscillator type watch construction using low power complementary MOS circuits. The oscillator-frequency converter combination of that patent is described as suitable for driving conventional watch hands over a watch dial or, alternatively for selectively actuating the display elements of an optical display in response to the drive signal output of the converter. In assignee's U.S. Pat. No. 3,576,099, issued Apr. 27, 1971, there is disclosed an improved watch construction in which the optical display is described as a plurality of light-emitting diodes which are intermittently energized to assure a minimum power consumption and an increasingly long life for the watch battery.

An improved watch construction of this general type incorporating solid state circuits and integrated circuit techniques is disclosed in assignee's copending United States patent application Ser. No. 35,196, filed May 6, 1970, now U.S. Pat. No. 3,672,155. The present invention is directed to an improved watch construction of the same general type as disclosed in the above-mentioned application and patents and one which utilizes no moving parts to perform the timekeeping function. In particular, the present invention is directed to an electronic wristwatch construction in which substantially all of the electrical components are formed as large-scale integrated circuits so as to reduce both the cost and size of the watch components. Through the use of large-scale integrated circuits, it is possible to utilize standardized, mass production fabrication of the electrical components which not only substantially reduces the cost of the watch, but, because of the reduction in size, makes more space available in a conventional wristwatch case for the watch battery and other wristwatch components.

In the present invention, the wristwatch comprises a frequency standard, preferably operating at a frequency of 32,768 Hz. and formed as a crystal controlled complementary MOS inverter used as an oscillator. Output signals from the frequency standard pass through a frequency converter, preferably in the form of a multi-stage binary frequency divider constructed of complementary MOS transistors. The signal is divided down in the frequency converter to produce an output at 1 Hz. The display actuator is formed by a plurality of registers, gates and decoders which drive an electro-optical display, preferably in the form of a bar segment arrangement of light-emitting diodes. Additional functions performed by the large-scale integrated circuit involve time setting, resetting, switching, and display intensity control.

Through the use of NOR and NAND logic circuits and complementary MOS transistors, it is possible through the present invention to construct a solid state watch in which all but a very few of the electrical components may be formed using large-scale integration, commonly referred to as LSI. As presently constructed, the large-scale integrated circuit requires 635 gates and 26 output drivers and since the circuit is fabricated using complementary MOS transistors, this means a total of 1270 transistors. However, only the 26 output drivers or buffers carry high currents so that extremely small transistors can be used and nearly 60% of the gates are used in flip-flops so that if desired, further simplification and reduction in the number of components is readily possible.

The watch display preferably comprises a red colored filter which passes cold red light from a plurality of gallium arsenide phosphide light-emitting diodes which are preferably arranged in a seven bar segment array. The light-emitting diodes are energized in appropriate time relationship with an effective brightness determined by an intensity control circuit utilizing a photosensitive detector. Situated on the front of the watch adjacent the display is a pushbutton demand switch which, when depressed, instantly activates the appropriate visual display stations. Minutes and hours are programmed to display for one and one-quarter seconds with just a touch of the demand switch. Continued depression of this switch causes the minute and hour data to fade and the seconds to immediately appear. The seconds continue to count as long as the wearer depresses the demand button. Computation of the precise time is continuous and completely independent of whether or not time is displayed.

Setting is accomplished by actuating either an hour-set switch or a minute-set switch. The hour-set switch rapidly advances the hours without disturbing the timekeeping of the minutes and seconds. Actuation of the minute-set switch automatically zeros the seconds while advancing the minutes to the desired setting.

The watch of the present invention is virtually shockproof and waterproof regardless of the environment in which it is placed. The electrical components and the display may be encapsulated with a clear potting compound so that no mechanical forces or corrosive elements can attack the electronics. Since there is no conventional stem for winding or setting, the small shaft sealing problem is eilminated. No maintenance or repair is normally necessary since the components are sealed and inaccessible to influences from the outside world. All solid state electric components including the light-emitting diode displays have a virtually unlimited life.

It is therefore one object of the present invention to provide an improved electronic wristwatch.

Another object of the present invention is to provide a wristwatch which utilizes no moving parts for performing the timekeeping function.

Another object of the present invention is to provide a completely solid state electronic wristwatch in which the display is in the form of a plurality of light-emitting diodes.

Another object of the present invention is to provide an electronic watch including an illuminated display in which the light level is automatically compensated to the viewing conditions for increased eye comfort and reduced power drain.

Another object of the present invention is to provide an improved timepiece having reduced size and cost for incorporation in a conventional man's wristwatch case.

Another object of the present invention is to provide an improved solid state timepiece in which substantially all of the electrical components are formed from large-scale integrated circuits.

These and further objects and advantages of the invention will be more apparent upon reference to the following specification, claims, and appended drawings, wherein:

FIG. 1 is a perspective view of a conventional sized man's wristwatch constructed in accordance with the present invention;

FIG. 2 is a simplified block diagram showing the principal components of the wristwatch of FIG. 1;

FIG. 3 shows a seven bar segment light-emitting diode array forming a part of the display of wristwatch of FIGS. 1 and 2;

FIG. 4 is a diagram of an oscillator forming the time base or frequency standard of FIG. 3;

Figure 5:
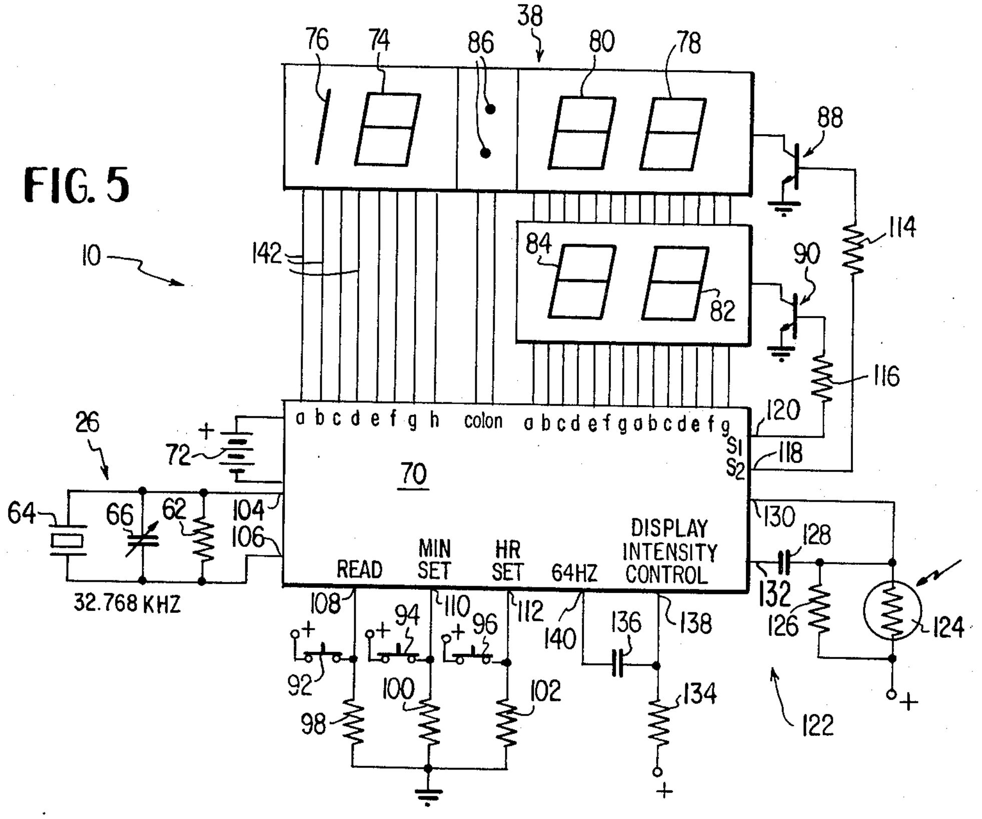
FIG. 5 is a more detailed circuit diagram of the wristwatch of the present invention showing in block form the large-scale integrated circuit.
Figures 7, 8:
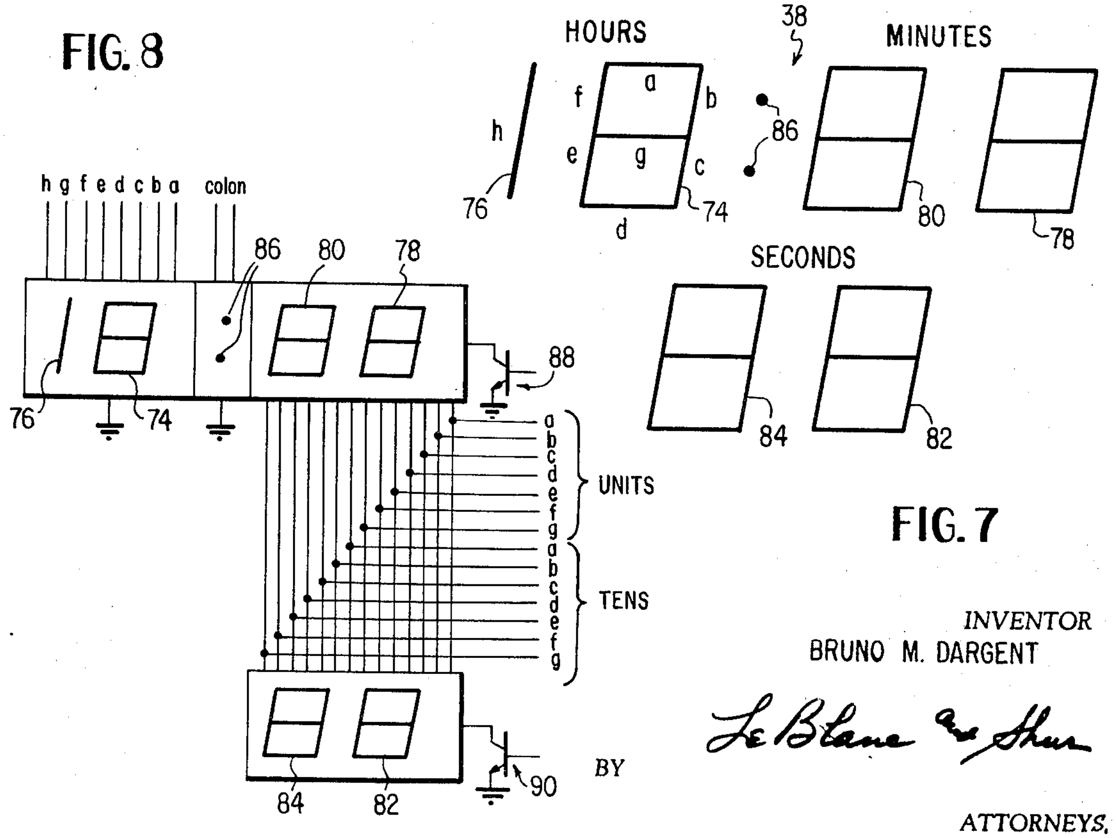
Figure 6A:
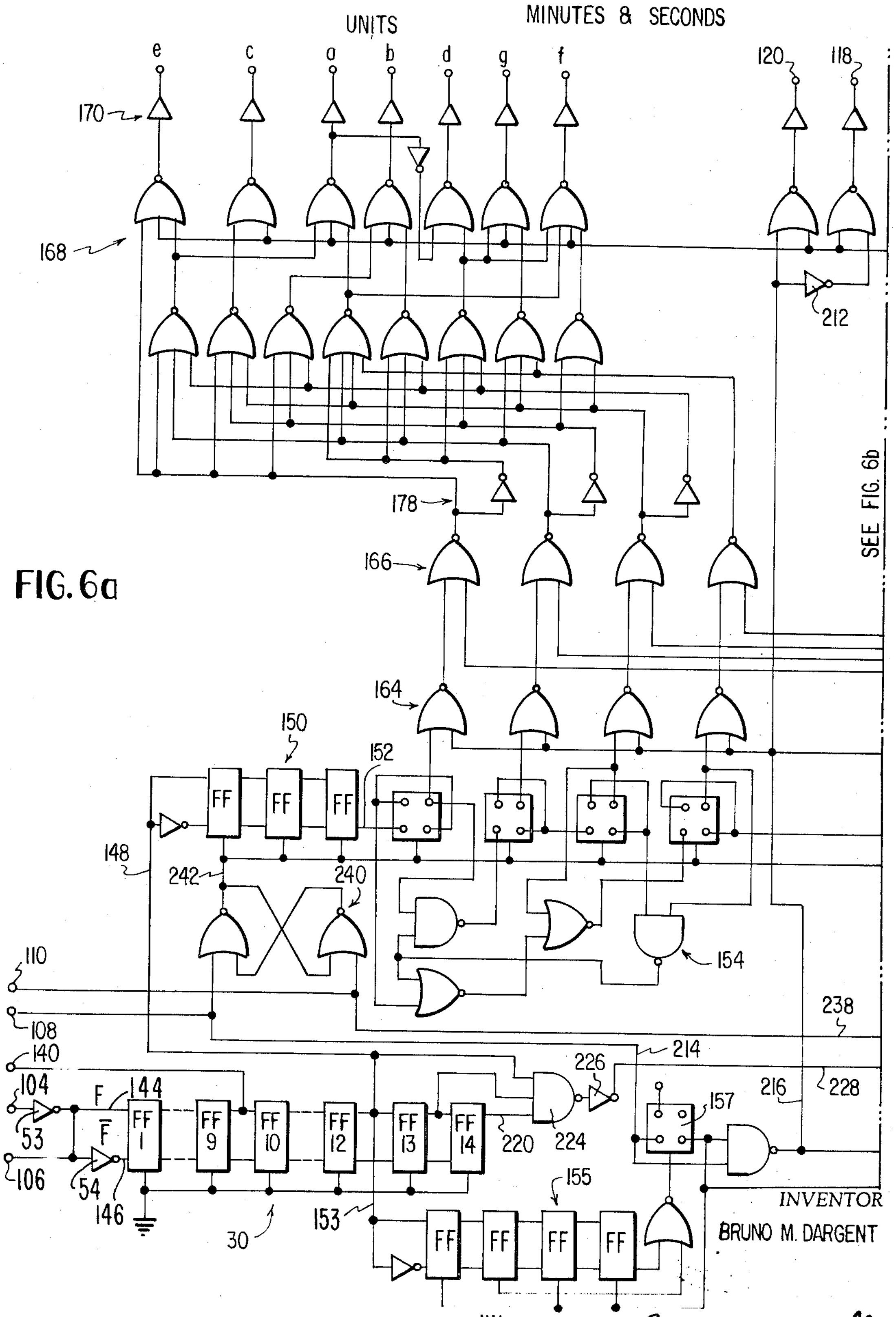
Figure 6B:
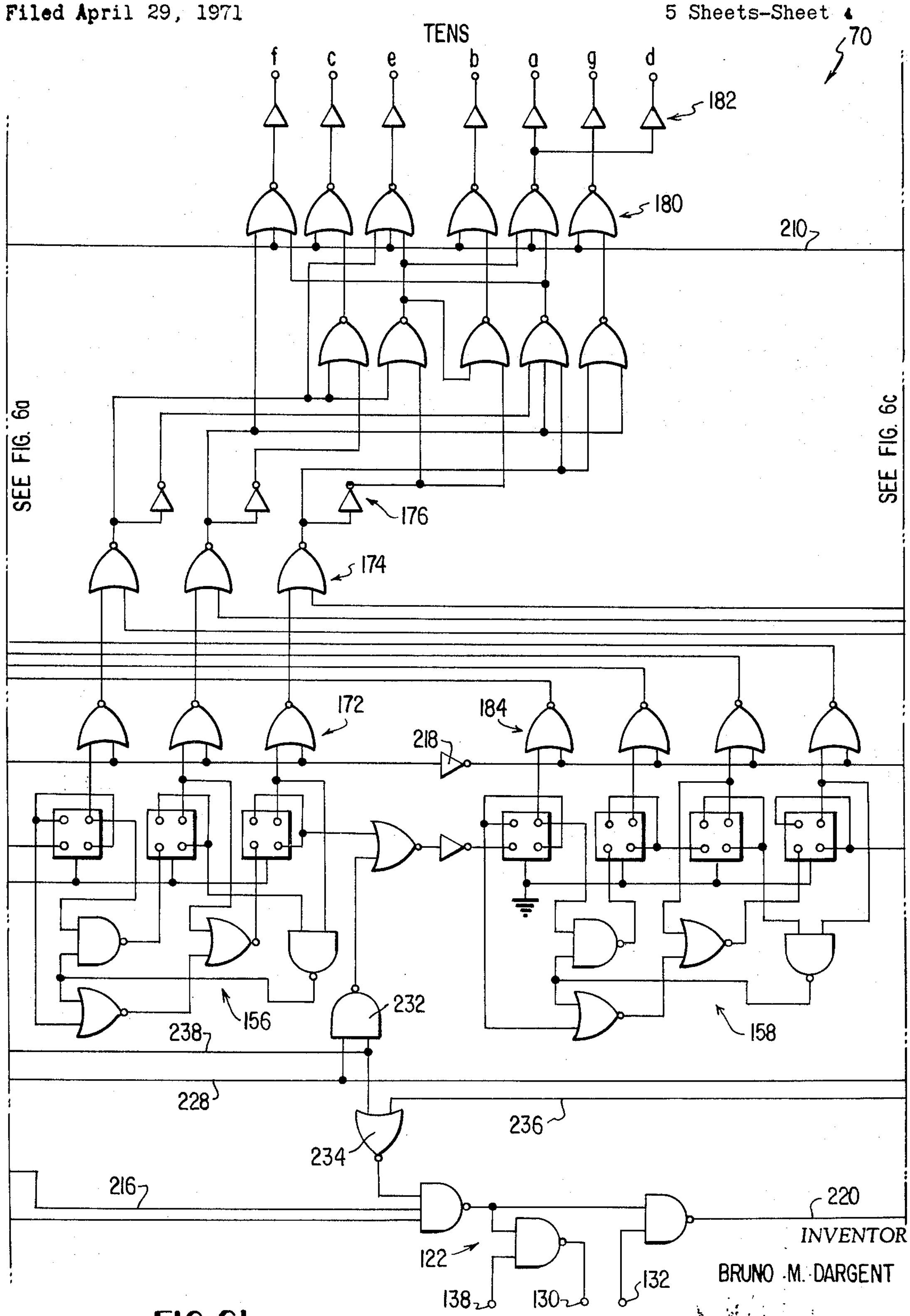
Figure 6C:
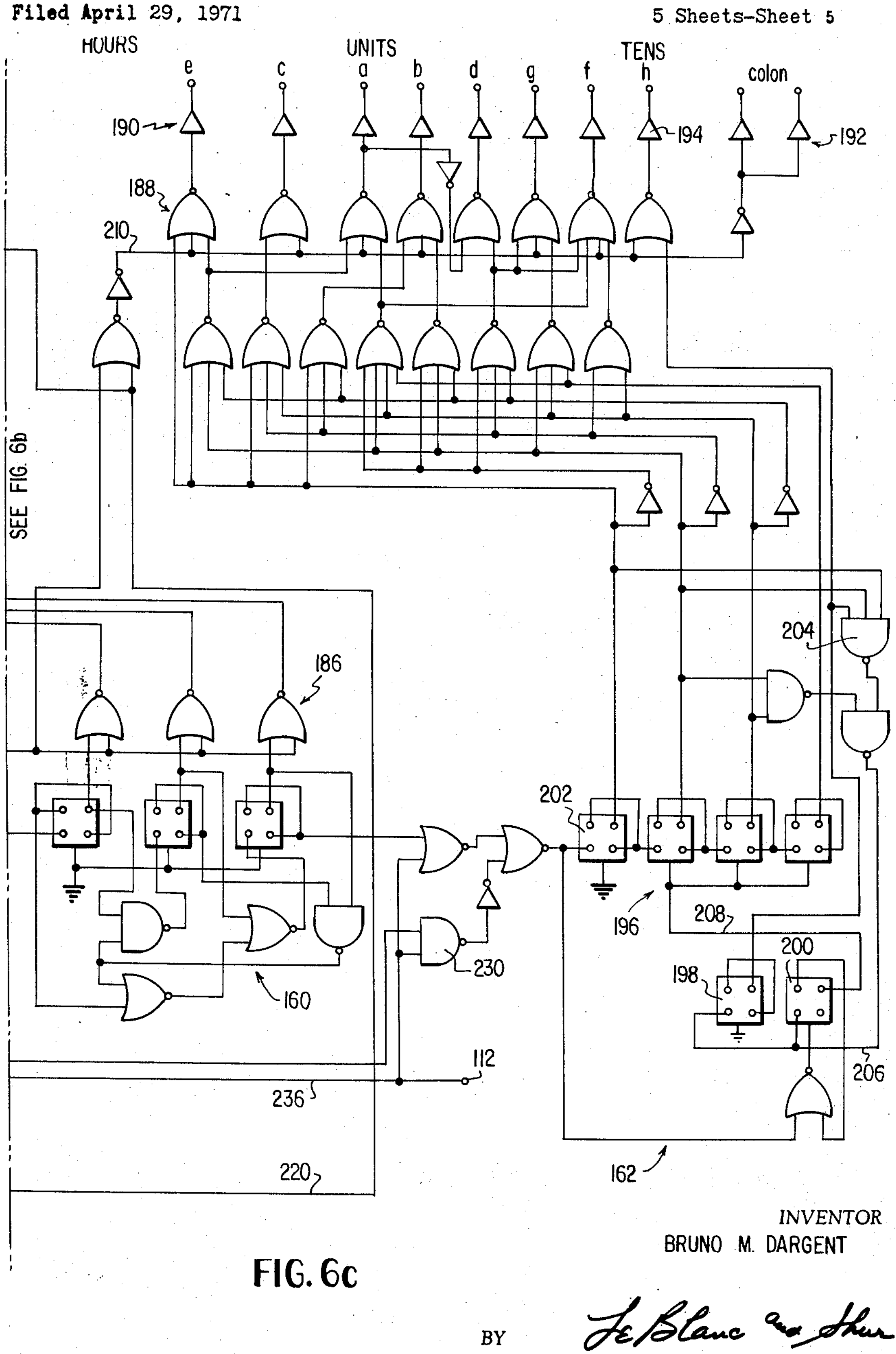

FIGS. 6*a*, 6*b* and 6*c* taken together constitute a detailed block diagram of the large-scale integrated circuit of FIG. 5;

FIG. 7 shows the arrangement of the light-emitting diode bar segments in the watch of the present invention; and FIG. 8 shows the manner in which the bar segments are connected to the display actuator.

Referring to the drawings, the novel watch of the present invention is generally indicated at 10 in FIG. 1. The watch is constructed to fit into a watch case 12 of approximately the size of a conventional man's wristwatch. The case 12 is shown connected to a wristwatch strap 14 and includes a display window 16 through which time is displayed in digital form as indicated at 20. The window may desirably be closed off by a red filter to enhance the display. Mounted on the case 12 is a pushbutton demand switch 18 by means of which the display 20 may be actuated when the wearer of the wristwatch 10 desires to ascertain the time.

In normal operation, time is continuously being kept but is not displayed through the window 16. That is, no time indication is visible through the window and this is the normal condition which prevails in order to conserve battery energy in the watch. However, even though the time is not displayed through the window 16, it is understood that the watch 10 continuously keeps accurate time and is capable of accurately displaying this time at any instant. When the wearer desires to ascertain the correct time, he depresses the pushbutton 18 with his finger and the correct time immediately is displayed at 20 through the window 16, which shows a dot display giving the correct time reading at 10:10, namely, ten minutes after ten o'clock. The hours and minutes, i.e., 10:10, are displayed through the window 16 for a predetermined length of time, preferably one and one-quarter seconds, irrespective of whether or not the pushbutton 18 remains depressed. The exact time of the display is chosen to give the wearer adequate time to consult the display to determine the hour and minute of time. Should the minutes change during the time of display, this change is immediately indicated by advancement of the minute reading to the next number, i.e., 11, as the watch is being read. If the pushbutton 18 remains depressed, at the end of one and one-quarter seconds, the hours and minutes of the display are extinguished, i.e., they disappear, and simultaneously, the seconds reading is displayed through the window 16 immediately below the hours and minutes display 20. The advancing seconds cycling from 0 to 59 continue to be displayed through window 16 until the pushbutton switch 18 is released.

FIG. 2 is a simplified block diagram of the principal components of the watch 10 of FIG. 1. The watch comprises a time base or frequency standard 26, preferably chosen to produce an electrical output signal on lead 28 at a frequency of 32,768 Hz. This relatively high frequency is supplied to a frequency converter 30 in the form of a divider which divides down the frequency from the standard 26 so that the output from the converter 30 appearing on lead 32 is at a frequency of 1 Hz. This signal is applied to the display actuator 34 which in turn drives the display 20 of the watch by way of electrical lead 36. While FIG. 2 shows both an hours and minutes display, i.e., 10:10, and a seconds display, i.e., 59, it is understood as previously described that these do not occur simultaneously but instead the hours and minutes are first displayed for a predetermined time and if the pushbutton remains depressed, the hours and minutes are extinguished and the seconds become visible. In this way all elements of the display are not simultaneously actuated, thus minimizing the power drain from the watch battery. For a more detailed description of the physical construction and mode of operation of the watch of the present invention, reference may be had to assignee's copending United States patent application Ser. No. 35,196, filed May 6, 1970, now U.S. Pat. No. 3,672,155, the disclosure of which is incorporated herein by reference.

While the watch illustrated in FIG. 1 employs a 27 dot matrix of light-emitting diodes for each display number, in the preferred embodiment the display takes the form of a seven bar segment of light-emitting diodes, preferably formed of gallium arsenide phosphide which emit light when energized in the visible red region of the spectrum. FIG. 3 shows a single display station or numeral 38 consisting of seven light-emitting diodes 40, 42, 44, 46, 48, 50, and 52 of elongated shape and arranged so that by lighting an appropriate combination of the bars any one of the numbers 0 through 9 may be displayed. The seven bar segment display of FIG. 3 is preferred in that it requires less energy for the optical display than the 27 dot matrix type illustrated in FIG. 1.

FIG. 4 is a circuit diagram of the frequency standard 26 of FIG. 2. The frequency standard is a crystal controlled oscillator comprising a complementary pair of integrated circuit enhancement transistors including a P-channel transistor 53 and a N-channel transistor 54 connected between the positive supply terminal 56 and the other or grounded side of the power supply as indicated at 59. The F and $\overline{F}$ outputs for the divider 30 of FIG. 2 are developed on output leads 58 and 60 in FIG. 4. The divider is preferably of the type shown and described in assignee's U.S. Pat. No. 3,560,998, the disclosure of which is incorporated herein by reference. Transistors 53 and 54 in FIG. 4 form an MOS integrated circuit inverter and have connected across them a bias resistor 62, a quartz crystal 64, and a variable tuning capacitor 66. Connected between the positive power supply terminal 56 and the transistor gate is a protective diode 68.

The active element of the oscillator 26 of FIG. 4 is the complementary MOS inverter with the protective diodes 68 and 69 between the gate and source of each of the transistors 53 and 54. This inverter can be a separate device but is preferably a part of the integrated circuit divider chain as more fully described below. The bias resistor 62 is used to bias the inverter into the linear region by making the input voltage equal to the output voltage under static conditions. Once the oscillator is under the control of the crystal, the bias resistor 62 is no longer a significant part of the circuit. A typical value for the bias resistor is about 22 megohms. Quartz crystal 64 is of the type normally used in oscillators where the Q is high and the series resistance is low. The shunt capacitance of the crystal should be less than 10 picofarads. Tuning capacitor 66 is used to adjust the oscillator over a narrow range of frequencies. The value of this capacitor is normally between 0.5 and 5.0 picofarads. Oscillator 26 provides the two-phase output required by the first stage of the divider chain.

The gate protective diodes 68 and 69 are desirable because in MOS transistors it is easy to permanently damage the transistor by applying a voltage to the gate which is higher than the source or substrate voltage. A high positive or negative potential on the gate will cause arcing across the gate dielectric which will create pinholes in the dielectric and alter the transistor characteristics. By adding the diodes 68 and 69 between the gate and source of the transistors, a current path is provided when the gate voltage is higher than the source potential.

FIG. 5 is a circuit diagram of the watch 10 of the present invention with like parts bearing like reference numerals. The integrated circuit portions of the watch are illustrated by the large block 70. This block may be formed of one or several integrated circuit chips but it is understood that all the components within the block 70 (which components are illustrated in FIG. 6) are formed by large-scale integrated circuit techniques. In addition to the integrated circuit 70 in FIG. 5, the watch comprises a battery 72 which, by way of example only, may comprise a conventional 3 volt wristwatch battery. This battery energizes the display 38 which is shown in FIG. 5 as consisting of a pair of hours stations comprising the digits station 74 and tens station 76, a pair of minutes stations comprising the digits station 78 and tens station 80, and a pair of seconds stations comprising the digits station 82 and the tens station 84. In addition, the display 38 includes a pair of colon dots 86, each formed by a single light-emitting diode. The display stations are energized through a pair of bipolar switching transistors 88 and 90, labeled $S_1$ and $S_2$, respectively.

The external components of the oscillator 26 in FIG. 5 are the crystal 64, the variable capacitor 66 and the bias resistor 62. The remaining portions of the oscillator shown in FIG. 4 are incorporated in the integrated circuit 70 of FIG. 5. Also external to the integrated circuit is a demand or read switch 92 which is closed when the button 18 of FIG. 1 is depressed. Further manually operated switches external to the integrated circuit 70 are a minute-set switch 94 and an hour-set switch 96. These switches are connected across battery 72 from the positive side of the battery to ground through respective series resistors 98, 100, and 102. The external oscillator components are connected to the integrated circuit 70 at terminals 104 and 106 and the switches 92, 94, and 96 are connected to the integrated circuit terminals 108, 110, and 112, respectively. Switches 88 and 90 are connected through respective resistors 114 and 116 to the integrated circuit terminals 118 and 120. The resistors associated with the switches are used in order to ground the corresponding inputs, otherwise the corresponding inputs would be floating and could be anything. When closed, the switches are used to switch the input voltages from ground to plus.

A feature of the watch of the present invention is that the intensity of the light emitted from the display diodes is varied in accordance with ambient light. That is, the diode light intensity is increased for greater contrast when the ambient light is bright, such as during daytime display, whereas the intensity of the light from the diodes is decreased when ambient light decreases. The automatic display intensity control circuitry is generally indicated at 122 in FIG. 5 and comprises a photosensitive resistor 124 suitably mounted on the face of the watch connected to the positive side of battery 72 and to a resistor 126 and capacitor 128. These components are connected to terminals 130 and 132 of the integrated circuit 70. Also forming a part of the intensity control circuit 122 is a resistor 134 having one end connected to the positive side of battery 72 and its other side connected to a capacitor 136. Resistor 134 is connected to the integrated circuit 70 at terminal 138 and capacitor 136 is connected to the 64 Hz. terminal 140 of the integrated circuit. This terminal connects to a point on the divider in integrated circuit 70 having a frequency of 64 Hz. Finally, timing signals from the integrated circuit 70 are supplied by the leads 142 to the respective display stations.

FIGS. 6*a*, 6*b* and 6*c* taken together constitute a detailed block diagram of the integrated circuit 70 of FIG. 5. In FIGS. 6*a*, 6*b* and 6*c*, like parts bear like reference numerals.

Referring to FIGS. 6*a*, 7, and 8, a signal from leads 58 and 60 of oscillator 26 in FIG. 4, identified as F and $\overline{F}$ in FIG. 6*a*, having a frequency of 32,768 Hz. is applied to a 14-stage, non-resettable counter forming the frequency converter 30 of FIG. 2. The counter is formed from 14 stages of binary flip-flops in a counting chain and each stage is comprised of complementary MOS transistors as previously described. A signal having a frequency of 64 Hz. is taken from the output of the 9th stage of the divider and applied to terminal 140. The output of the 12th stage of the divider having a frequency of 8 Hz. is applied by way of a lead 148 to the input of a three-stage resettable counter 150 comprising three stages of MOS complementary symmetry transistor flip-flops which produce an output on lead 152 having a frequency of 1 Hz. The 8 Hz. signal from the divider is also applied by way of a lead 153 to a 4-stage flip-flop decade counter 155, the output of which counter or control timer 155 controls a one and one-quarter second timing flip-flop 157.

The 1 Hz. signal on lead 152 is applied to a seconds units storing register 154 which divides by 10 and whose output is in turn connected to a seconds tens register 156 which divides by 6. The seconds tens register in turn has its output connected to a minutes units register 158 which again divides by 10 and the output of this register is connected to a minutes tens register 160 which divides by 6. The output of register 160 is in turn connected to a divide by 12 hours register, generally indicated at 162. These registers are all comprised of binary chains of complementary MOS transistor pairs and the individual stages, except for the control terminals, are in all respects similar to the individual stages of the binary divider 30. For a detailed discussion of an individual stage forming a stage of either the divider 30, divider 150, or one of the registers 154, 156, 158, 160, and 162, reference may be had to assignee's U.S. Pat. No. 3,560,998.

Output signals indicative of seconds units of time are developed in register 154 and these are applied through four selection gates 164 and through input gates 166 to a units decoder 168. The decoder 168 converts the binary coded decimal signals from the register 154 into suitable drive signals for the displays which are applied to the light-emitting diodes of the units display through the buffer amplifiers 170. The individual bar segments are labeled *a* through *g* and the relationships of the segments and their interconnections to the outputs of the non-inverting buffer amplifiers 170 is illustrated in FIGS. 7 and 8.

Register 156 is similarly connected through selection gates 172 which are shown as three in number and correspond in all respects to the selection gates 164 previously described. The outputs of selection gates 172 are applied through input gates 174 and three inverters 176, which correspond to the input gates 166 previously described and the corresponding inverters 178 connected to those gates. Gates 174 and inverters 176 connect through a tens decoder 180 to the tens non-inverting buffers or drivers 182. Decoder 180 corresponds to decoder 168 previously described and buffers 182 are similar to the buffers 170. The outputs of buffers 182 drive the tens display diodes and their interconnection and relationship is again illustrated in FIGS. 7 and 8.

Register 158 is connected to input gates 166 through selection gages 184 and the binary coded decimal output of register 160 is similarly connected through three selection gates 186 to the input gates 174 for the tens display. In this way, the two units or digits registers 154 and 158 are connected through common input gates to the common decoder 168 and common drivers 170 and the tens registers 156 and 160 are similarly connected through the common input gates 174 to the common decoder 180 and common buffers 182.

Register 162 has a binary coded decimal output which is applied directly to a decoder 188 and through buffers 190 to the hours units and tens display diodes. The colon diodes are energized through separate buffers 192 and the hours tens digit is energized through a separate buffer 194 since the hours tens diode 76 in FIG. 7 is in actuality a commonly connected pair of light-emitting diode segments which are both either simultaneously on or simultaneously off to indicate either 1 or no indication at all for the hours tens digit.

The integrated circuit 70 of FIGS. 6*a*, 6*b* and 6*c* performs the functions of time base generation, time storage, and information decoding, as well as the miscellaneous functions of display timing, automatic intensity control, and display selection. The circuit is designed to operate at 2.5 to 3.2 volts and to use .100 inch light emitting diode displays. The time base generator portion of the circuit consists of external components (crystal, resistor, and trimming capacitor), an inverter used as an oscillator, and a 14-stage non-resettable counter, as well as the three-stage resettable counted 150. The fourteen-stage counter 30 provides the frequencies used throughout the system to perform such functions as timing, setting, resetting, switching, and display intensity control. The three-stage counter 150 is resettable because it acts as a "hold" circuit during minute setting. After the minutes have been set, this counter remains in the reset mode which keeps a signal from passing into the seconds storage register until the read or demand button 18 of FIG. 1 has been depressed and the read switch 92 of FIG. 5 closed. This counter consists of three stages so that the error upon starting is no greater than ⅛ of a second.

The time storage portion of the circuit consists of three registers, two divide by 60 and another divide by 12. The first divide by 60 register is resettable and is used to accumulate seconds. Both divide by 60 registers are subdivided into divide by 10 and divide by 6 sections such that the first divide by 60 register is formed by the register sections 154 and 156 and the second divide by 60 register is formed by register sections 158 and 160. This division is provided because the time information must be displayed as decimal numbers. The divide by 12 register 162 displays the numbers 1 through 12 and resets to 1. This is accomplished by making the first flip-flop in the divide by 10 section indicated generally at 196 non-resettable. The first four flip-flops 196 constitute the divide by 10 section, the next flip-flop 198 controls the tens of hours, and the last flip-flop 200 is used to insure positive resetting. At the count of 10, 8 and 2 are detected. This sets the tens of hours flip-flop 198 and triggers the resetting flip-flop 200 which resets stages 2, 4, and 8. Stage 1, i.e., flip-flop 202, is already at "zero" so the units hours decodes to 0. However, at 13, an AND gate 204 reads the tens of hours and stages 1 and 2. This toggles the tens of hours flip-flop 198 by way of lead 206 back to 0 and resets stages 2, 4 and 8 by way of lead 208. Stage 1, i.e., flip-flop 202, is not reset and therefore the number 1 is decoded. However, this happens so rapidly that the number 13 is never displayed.

There are three information decoders, namely, the decoders 168, 180, and 188. These decode the 8–4–2–1 binary coded decimal information stored in the registers to seven segment signals matching the seven segment displays. The outputs of the decoders are connected to the noninverting buffers 170, 182, and 190, which supply power necessary to drive the display segments. These decoders have incorporated into them the ON/OFF line 210 which enables the decoded information to be isolated from the buffers so that information is displayed only upon demand. This ON/OFF line 210 is also used to control the display intensity through the intensity control circuit 122 which regulates the length of the ON signal. Since the minutes and seconds both display from 00 to 59 and neither of these displays are ON simultaneosuly, it is possible to use the same decoder for both. This is done by placing the input gates or NOR gates 166 and 174 at the input to the decoders. An inverter 212 is connected between the minutes and seconds switches $S_1$ and $S_2$ coupled to terminals 118 and 120 so that when one transistor switch is closed, the other is open. This inverter, in combination with the switches in the cathode leads of the displays as illustrated in FIG. 8, determines which information is decoded and displayed, i.e., when the minutes display is ON, the seconds display is OFF and vice versa. The hours display has its own decoder 188 and this decoder also controls the colon dots between the hours and minutes displays through the buffers 192.

The display timer is generally indicated at 155 in FIG. 6*a*. This timer automatically turns off the hours and minutes after one and one-quarter seconds. A momentary depression of the read or demand button 18 produces a corresponding closure of the manual switch 92 in FIG. 5 and this completes a setting circuit by way of lead 214 in FIG. 6*a* to set flip-flop 157. This flip-flop is reset only after the decade counter 155 has counted ten pulses of an 8 Hz signal applied to it over lead 153. As long as flip-flop 157 is in the set condition, it puts the proper signal on lead 216 to the switches $S_1$ and $S_2$ and also supplies the proper signal to the selection gates with the minutes and seconds selection gates separated by an inverter 218 so that both sets are not energized at the same time. If the read or demand button remains pressed after the decade counter 157 has completed its cycle, the display automatically reverts to a display of seconds.

The automatic intensity control circuit 122 senses the ambient light conditions and then adjusts the duty cycle of the ON signal which activates the displays. This signal is carried over lead 220 which connects with line 210 to the decoders. Therefore, under bright light conditions, the displays are on nearly 100% of the time while under darkened conditions, the duty cycle may be as low as several percent. The light control circuit, a major portion of which appears in FIG. 5 as well as in FIG. 6*b*, is in essence a multivibrator which is triggered at a rate of 64 Hz. from the divider terminal 140. The length of the pulse generated by the multivibrator is determined by the fixed capacitor 128 and the light sensitive resistor 124. These 64 Hz. pulses, having a variable width and therefore a variable duty cycle in accordance with ambient light intensity, are supplied over lead 220 to the decoders by way of line 210.

Divider 30 is a 14 stage binary device and produces a 2 Hz. output on lead 222 which is applied through NAND gate 224 and inverter 226 to lead 228 and the input of hours register 162. Closure of hours-set switch 96 (FIG. 5) causes the 2 Hz. setting signal to be applied through NAND gate 230 to the hours register setting the hours display at the "fast" rate of two hours per second. The 2 Hz. setting signal is also applied to NAND gate 232 so that closure of the minute-set switch 94 coupled to terminal 110 causes the 2 Hz. signal to pass through gate 232 to the input of minute units register 158. This is a "slow" or fine setting with the minutes advanced at two per second. A display during setting is assured by connecting hour-set terminal 112 and minute-set terminal 110 through NOR gate 234 to the display intensity control ciricuit 122 through leads 236 and 238, respectively.

Operation of the minute-set switch applies a reset impulse from terminal 110 through NOR gates 240 to lead 242 which resets counter 150 and seconds registers 154 and 156 to zero. In this way, the seconds display is automatically zeroed when the minutes are set. Counting is resumed in the seconds register as soon as the read switch is depressed.

It is apparent from the above that the present invention provides an improved solid state watch construction having no moving parts and particularly a wristwatch construction in which a vast majority, i.e., substantially all, of the electrical components are formed from a large-scale integrated circuit. As disclosed, the integrated circuit requires 635 gates and 26 output drivers. The circuit is fabricated in its entirety from complementary symmetry MOS transistors, thus requiring a total of 1270 transistors. Only the buffers carry high currents so that small transistors can be used throughout substantially the entire circuit.

Important features of the invention include the electronically regulated timekeeping device characterized by sufficiently small size and low power dissipation to be practical for use in a device of wristwatch size. Through the use of large-scale integration, the circuit may be more economically manufactured and permits more space in a conventional wristwatch case for a battery, crystal, and other components. While the preferred embodiment and certain especially significant operating conditions have been set forth in detail, it should be understood that various modifications are readily apparent. In the preferred embodiment, the light-emitting diodes take the form of gallium arsenide phosphide LED's of the type more fully shown and described in assignee's United States Pat. No. 3,576,099, issued Apr. 27, 1971, the disclosure of which is incorporated herein by reference. However, it is understood that the display can assume any one of several forms. For example, the optical display may be formed using such well known devices as miniature incandescent bulbs, other types of light-emitting diodes, or the well known liquid crystals, as well as lesser known devices, such as ferro-electric crystals or electro-luminescent displays and others. If desired, the electrical signals may be connected through a suitable electromechanical transducer or motor to drive conventional watch hands.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed and desired to be secured by United States Letters Patent is:

1. A solid state timing device having sufficiently small size and power consumption for use as a wristwatch comprising a source of constant frequency electrical signals, an electro-optical display, said display including means for displaying the hours, minutes and seconds of time in decimal number form, and a large-scale integrated circuit electrically coupling said source to said display, said integrated circuit including a divider for dividing down the frequency of the signals from said source, a seconds register, a minutes register and an hours register all coupled to the output of said divider, means coupling said hours register to said display, and a common decoder coupling both said seconds and minutes registers to said display.

2. A timing device according to claim 1, including a read switch, and means responsive to operation of said read switch for alternatively coupling said seconds and minutes registers to said display through said common decoder.

3. A timing device according to claim 2, wherein said read switch responsive means comprises a plurality of selection gates coupling said seconds and minutes registers to said common decoder.

4. A timing device according to claim 3, wherein said display comprises a 7-bar segment array of light emitting diodes.

5. A timing device according to claim 3, including a flip-flop having its output coupled to said selection gates, a first input of said flip-flop being coupled to said read switch, and a second input of said flip-flop being coupled to said timer.

6. A timing device according to claim 5, wherein said flip-flop has set and reset terminals, said set terminal being coupled to said read switch and said reset terminal being coupled to said timer.

7. A timing device according to claim 6, wherein said timer is coupled to an intermediate stage of said divider.

8. A timing device according to claim 7, wherein said timer is a decade counter.

9. A timing device according to claim 8, wherein said timer is coupled to an 8 Hz. output from said divider whereby said flip-flop is reset after one and one-quarter seconds.

10. A solid state wristwatch comprising a source of constant frequency electrical signals, an electro-optical time display, said display including means for displaying the hours, minutes and seconds in decimal number form, and a large-scale integrated circuit electrically coupling said source to said display, said integrated circuit including a divider for dividing down the frequency of the signals from said source, a seconds register coupled to said divider and including a divide by six section and a divide by ten section, a minutes register coupled to said seconds register and including a divide by six section and a divide by ten section, an hours register coupled to said minutes register, means coupling said hours register to said display, and a common decoder coupling both said seconds register and said minutes register to said display.

11. A wristwatch according to claim 10, wherein said common decoder comprises a units section and a tens section, said units section being coupled to the divide by ten sections of said minutes and seconds register and said tens section being coupled to the divide by six sections of said minutes and seconds registers.

12. A wristwatch according to claim 11, wherein said display includes separate seconds and minutes display portions, said tens and units sections of said decoder being coupled to both said portions of said display.

13. A wristwatch according to claim 11, wherein said display comprises a plurality of light emitting diodes.

14. A wristwatch according to claim 13, including a plurality of bipolar switches coupled to said diodes for energizing said diodes in accordance with the state of said switches, and a timer coupled to said switches for controlling the operation of said switches and the energization of said diodes.

15. A wristwatch according to claim 14, including a read switch coupled to said bipolar switches for energizing the minutes and hours diodes of said display on deman, said timer being coupled to said bipolar switches for extinguishing the hours and minutes diodes and energizing the seconds diodes of said display after a predetermined time.

16. A wristwatch according to claim 11, including a light intensity oscillator coupled to said display for causing it to turn on and off at a rate sufficiently high to give the appearance of constant illumination, said oscillator including a light sensitive element for varying the duty cycle of its output in accordance with the ambient light level.

17. A wristwatch according to claim 16, wherein said oscillator comprises a multivibrator triggered from said divider at a frequency of 64 Hz.

18. A wristwatch according to claim 11, wherein said divider includes an 8 Hz. output, and a three-stage resettable counter coupling said 8 Hz. output to the input of said seconds register.

19. A wristwatch according to claim 18, wherein said divider includes a 2 Hz. output, a manually operated hours set switch for coupling said 2 Hz. output to the input of said hours register, and a manually operated minute set switch for coupling said 2 Hz. output to the input of said minutes divide by ten register section.

20. A wristwatch according to claim 11, including noninverting buffers coupling said decoder to said display.

References Cited

UNITED STATES PATENTS

| | | | |
|---|---|---|---|
| 3,194,003 | 7/1965 | Polin | 58—23 R X |
| 3,664,116 | 4/1970 | Emerson et al. | 58—23 A |
| 3,485,033 | 12/1969 | Langely | 58—35 R X |
| 3,576,099 | 4/1971 | Walton | 58—23 R X |

RICHARD B. WILKINSON, Primary Eaminer

E. C. S. JACKMON, Assistant Examiner

U.S. Cl. X.R.

58—23; 235—92 T; 340—309.1; 350—160 LC